(12) United States Patent
Qing et al.

(10) Patent No.: US 9,799,287 B2
(45) Date of Patent: Oct. 24, 2017

(54) SHIFT REGISTER UNIT AND DRIVING METHOD THEREOF, GATE DRIVING CIRCUIT AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengu (Sichuan) (CN)

(72) Inventors: Haigang Qing, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/785,251

(22) PCT Filed: Apr. 13, 2015

(86) PCT No.: PCT/CN2015/076401
§ 371 (c)(1),
(2) Date: Oct. 16, 2015

(87) PCT Pub. No.: WO2016/086566
PCT Pub. Date: Jun. 9, 2016

(65) Prior Publication Data
US 2016/0365050 A1    Dec. 15, 2016

(30) Foreign Application Priority Data

Dec. 2, 2014    (CN) .......................... 2014 1 0723229

(51) Int. Cl.
G09G 3/36        (2006.01)
G11C 19/28      (2006.01)
(Continued)

(52) U.S. Cl.
CPC ......... *G09G 3/3648* (2013.01); *G02F 1/1343* (2013.01); *G02F 1/1368* (2013.01);
(Continued)

(58) Field of Classification Search
CPC . G09G 3/36; G09G 3/34; G11C 19/00; G02F 1/1345; G06F 3/038
See application file for complete search history.

(56) References Cited

U.S. PATENT DOCUMENTS 6,580,411 B1    6/2003   Kubota et al.
2005/0018807 A1  1/2005   Han et al.
(Continued)

FOREIGN PATENT DOCUMENTS

CN    1501346    6/2004
CN    202196566  4/2012
(Continued)

OTHER PUBLICATIONS

Chinese Office Action with English Language Translation, dated Mar. 25, 2016, Chinese Application No. 201410723229.8.
(Continued)

*Primary Examiner* — Pegeman Karimi
(74) *Attorney, Agent, or Firm* — Blakely Sokoloff Taylor & Zafman LLP

(57) ABSTRACT

Embodiments of the present disclosure provide a shift register unit and a driving method thereof, a gate driving circuit and a display device. The shift register unit comprises a latch module and a latch output module. Switching on and off of the transmission gates is controlled by using an intermediate signal generated based on a clock signal and an inputted signal, instead of by using the clock signal, such that the shift register unit will not be influenced by frequent flips of the clock signal in a non-operational state, thus avoiding a great deal of useless power consumption.

14 Claims, 4 Drawing Sheets

(51) Int. Cl.
*G02F 1/1343* (2006.01)
*G02F 1/1362* (2006.01)
*G02F 1/1368* (2006.01)

(52) U.S. Cl.
CPC ..... *G02F 1/136286* (2013.01); *G09G 3/3677* (2013.01); *G11C 19/28* (2013.01); *G11C 19/287* (2013.01); *G09G 2300/0426* (2013.01); *G09G 2310/0283* (2013.01); *G09G 2310/0286* (2013.01); *G09G 2310/0291* (2013.01); *G09G 2310/08* (2013.01); *G09G 2330/021* (2013.01)

(56) References Cited

U.S. PATENT DOCUMENTS

| | | | |
|---|---|---|---|
| 2006/0139077 A1* | 6/2006 | Miyamoto | G11C 19/00 327/218 |
| 2006/0171501 A1 | 8/2006 | Lim | |
| 2008/0062113 A1 | 3/2008 | Kim | |
| 2009/0256794 A1* | 10/2009 | Jang | G11C 19/28 345/100 |
| 2011/0221736 A1* | 9/2011 | Pak | G09G 3/3677 345/211 |
| 2013/0148775 A1* | 6/2013 | Shin | G11C 19/28 377/69 |

FOREIGN PATENT DOCUMENTS

| | | |
|---|---|---|
| CN | 102708777 | 10/2012 |
| CN | 103093825 | 5/2013 |
| CN | 104361875 | 2/2015 |
| JP | H1074060 | 3/1998 |
| WO | WO-2013026387 | 2/2013 |

OTHER PUBLICATIONS

Chinese Office Action with English Language Translation, dated Jun. 2, 2016, Chinese Application No. 201410723229.8.
International Search Report and Written Opinion with English Language Translation, dated Aug. 17, 2015, Application No. PCT/CN2015/076401.

* cited by examiner

SHIFT REGISTER UNIT AND DRIVING METHOD THEREOF, GATE DRIVING CIRCUIT AND DISPLAY DEVICE

CROSS-REFERENCE TO THE RELATED APPLICATIONS

The present application is the U.S. national phase entry of PCT/CN2015/076401, with an international filing date of Apr. 13, 2015, which claims the benefit of Chinese Patent Application No. 201410723229.8, filed on Dec. 2, 2014, the entire disclosures of which are incorporated herein by reference.

FIELD OF THE DISCLOSURE

The present disclosure relates to the field of display technology, and in particular to a shift register unit and a driving method thereof, a gate driving circuit and a display device.

BACKGROUND OF THE DISCLOSURE

A thin film transistor-liquid crystal display (TFT-LCD) is composed of pixel matrices defined by intersecting gate lines and data lines in both a horizontal direction and a vertical direction. When the TFT-LCD performs display, a gate line of each row is supplied with a gate signal to switch on the TFT controlled by the gate line of each row, such that a pixel electrode positioned in the same pixel as the TFT is connected with a date line. Then a voltage of a display signal is inputted to the pixel electrode by inputting the display signal into the data line. By controlling liquid crystal molecules at a position corresponding to the pixel electrode to deflect, different transmittances can be obtained and accordingly control over the grey level or color of a displayed image can be achieved. However, in the case of a high resolution, there are many outputs for both the gate driving and the source driving of the display, and the length of the driving circuit path will also increase, which will be adverse to the bonding process of a modular driving circuit.

To address the above concerns, a gate driver on array (GOA) circuit design is often used in the manufacture of an existing display, wherein a thin film transistor (TFT) gate switching circuit is integrated on an array substrate of a display panel to form scan driving of the display panel, which can save the bonding region and the peripheral wiring space of the gate driving circuit, thereby achieving an aesthetic design of the display panel with a side symmetry and a narrow bezel.

In the prior art, in order to achieve progressive scan, the GOA circuit comprises a plurality of shift register units. As shown in FIG. 1, a shift register unit in a traditional low temperature poly-silicon (LTPS) GOA circuit may constitute two latches (a first latch 01 and a second latch 02). Each latch 01 may comprise an inverter, two transmission gates and a NAND gate, and is capable of transmitting and shifting an inputted control signal D by using a clock signal Clk (or Clk_). Specifically, upon switching on of the first latch 01, the control signal D inputted by a preceding stage shift register unit enters the latch 01, at which point the second latch 02 is switched off such that the signal cannot be inputted. When the next clock signal arrives, the first latch 01 is switched off to latch the control signal D, at which point the second latch 02 is switched on to allow the control signal D to enter the second latch 02 and be outputted therefrom, thereby achieving the shifting operation of the control signal D.

Within the scan time for a frame, the shift register unit will be in a non-operational state when it accomplishes shifting output. Therefore, for the entire display panel, when a stage of shift register unit is in an operational state, all other shift register units are in a non-operational state. However, even in a non-operational state, the transmission gates controlled by the clock signal in each shift register unit will still be switched on and off frequently by the clock signal during signal flips. As a transmission gate is formed by complementary transistors connected in parallel, a gate capacitor composed of a gate and a substrate in the transistor will be charged and discharged many times during the switching on and off of the transmission gates. As such, the clock signal loaded onto the transmission gates will cause much useless power consumption, which greatly reduces the utilization efficiency of the display driving capacity.

SUMMARY OF THE DISCLOSURE

Embodiments of the present disclosure provide a shift register unit and a driving method thereof, a gate driving circuit and a display device, for solving the problem of much useless power consumption due to clock signal flips in a non-operational state.

To achieve the above goal, embodiments of the present disclosure adopt technical solutions as follows:

According to a first aspect of embodiments of the present disclosure, a shift register unit is provided, comprising a latch module and a latch output module, wherein the latch module is connected to a first voltage terminal, a second voltage terminal, a first clock signal terminal, an input terminal and a control terminal of the latch output module, respectively, the latch module being used for controlling switching on and off of a latch function of the latch module and the input terminal of the latch output module depending on a signal inputted by the input terminal of the latch module and a signal inputted by the first clock signal terminal; and wherein the latch output module is connected to the first voltage terminal, a second clock signal terminal, a same-stage signal output terminal and an output terminal of the latch module, respectively, the latch output module being used for outputting a signal inputted by the second clock signal terminal to the same-stage signal output terminal when the input terminal of the latch output module is switched on, and for isolating the signal inputted by the second clock signal terminal when the input terminal of the latch output module is switched off. The latch output module is connected to the first voltage terminal, the second clock signal terminal, the same-stage signal output terminal and the latch module respectively, for outputting the signal inputted by the second clock signal terminal to the same-stage signal output terminal when the input terminal of the latch output module is switched on, and isolating the signal inputted by the second clock signal terminal when the input terminal of the latch output module is switched off.

According to a second aspect of embodiments of the present disclosure, a gate driving circuit is provided, comprising at least two stages of shift register units according to the first aspect of the present disclosure.

According to a third aspect of embodiments of the present disclosure, a display device is provided, comprising the gate driving circuit according to the second aspect of the present disclosure.

According to a fourth aspect of embodiments of the present disclosure, a method for driving the shift register unit according to the first aspect of the present disclosure is provided, wherein the second voltage terminal inputs a high level and the first voltage terminal inputs a low level, the method comprising: in a latch-switching-on phase, inputting by the input terminal of the latch module and the first clock signal terminal a high level, and inputting by the second clock signal terminal a low level, such that depending on the high level inputted by the input terminal of the latch module and the high level inputted by the first clock signal terminal, the latch module switches on the latch function of the latch module to latch the high level inputted by the first signal input terminal, and switches on the input terminal of the latch output module to output the low level inputted by the second clock signal terminal to the same-stage signal output terminal to allow output of a low level by the same-stage signal output terminal; in a data outputting phase, inputting by the input terminal of the latch module and the first clock signal terminal a low level, and inputting by the second clock signal terminal a high level, such that depending on the low level inputted by the input terminal of the latch module and the low level inputted by the first clock signal terminal, the latch module continues maintaining an on state of the input terminal of the latch output module, and the latch output module outputs the high level inputted by the second clock signal terminal to the same-stage signal output terminal to allow output of a high level by the same-stage signal output terminal; and in a signal isolating phase, inputting by the first clock signal terminal a high level, and inputting by the input terminal of the latch module and the second clock signal terminal a low level respectively, such that depending on the low level inputted by the input terminal of the latch module and the high level inputted by the first clock signal terminal, the latch module switches off the latch function of the latch module and the input terminal of the latch output module, wherein the latch module isolates the signal inputted by the first clock signal terminal, and the latch output module isolates the signal inputted by the second clock signal terminal and outputs the low level inputted by the first voltage input terminal to the same-stage signal output terminal to allow output of a low level by the same-stage signal output terminal.

The basic idea of the present disclosure lies in: switching on and off of the transmission gates is controlled by using an intermediate signal generated based on the clock signal and the inputted signal, instead of by using the clock signal, such that the shift register unit will not be influenced by the frequent flips of the clock signal in a non-operational state, thus avoiding a great deal of useless power consumption.

BRIEF DESCRIPTION OF THE DRAWINGS

In order to render the technical solutions in embodiments of the present disclosure or the prior art clearer, drawings to be used in the description of the embodiments or the prior art will be introduced briefly below. Apparently, the drawings described below are only some embodiments of the present disclosure, and for those having ordinary skills in the art, other drawings can also be obtained in accordance with these drawings without making inventive efforts.

DETAILED DESCRIPTION OF THE DISCLOSURE

The technical solutions in embodiments of the present disclosure will be described in a clear and complete manner with reference to the drawings in the embodiments of the present disclosure. Obviously, the embodiments described here are only a part of the embodiments of the present disclosure, rather than all of them. Other embodiments derived by those having ordinary skills in the art without making inventive efforts from embodiments of the present disclosure, shall all fall within the scope of the present disclosure.

Figure 1:
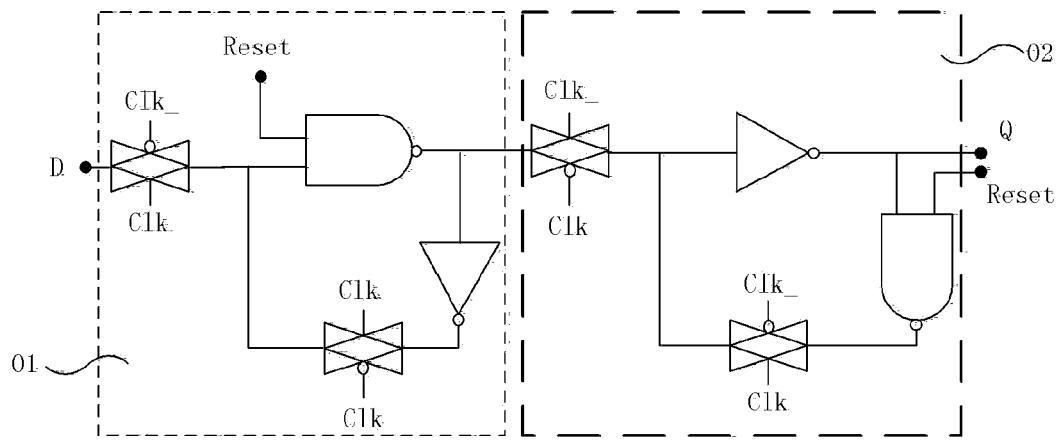
FIG. 1 is a schematic structural view of a shift register unit provided in the prior art.
Figure 2:
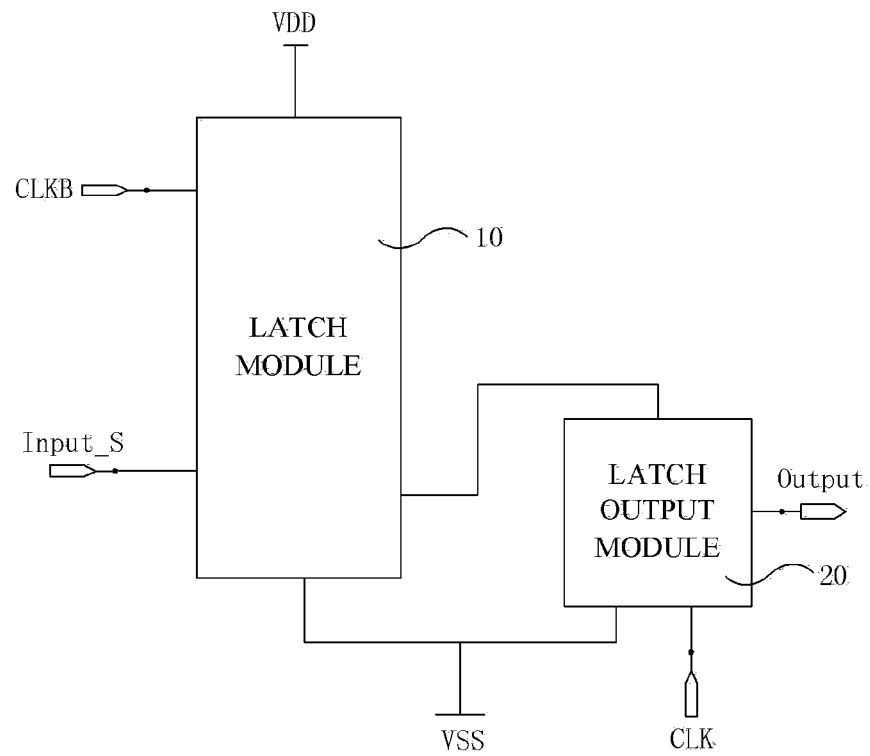
FIG. 2 is a schematic structural view of a shift register unit provided in an embodiment of the present disclosure.

FIG. 2 is a schematic structural view of a shift register unit provided in an embodiment of the present disclosure. As shown in the figure, the shift register unit may comprise a latch module 10 and a latch output module 20.

The latch module 10 may be connected to a first voltage terminal VSS, a second voltage terminal VDD, a first clock signal terminal CLKB, an input terminal Input_S and a control terminal of the latch output terminal module 20, respectively. The latch module 10 controls switching on and off of the latch function of the latch module 10 and the input terminal of the latch output module 20 depending on a signal inputted by the input terminal Input_S and a signal inputted by the first clock signal terminal CLKB.

Specifically, when the latch function of the latch module 10 is switched on, a high level inputted by the input terminal Input_S of the latch module 10 is latched. When the latch function of the latch module 10 is switched off, the signal inputted by the first clock signal terminal CLKB is isolated such that it cannot enter the shift register unit, until a next frame of high level is inputted into the latch module 10 (i.e., in a non-operational state of the shift register).

The latch output module 20 can be connected to the first voltage terminal VSS, a second clock signal terminal CLK, a same-stage signal output terminal Output and an output terminal of the latch module 10, respectively. Specifically, when the input terminal of the latch output module 20 is switched on, a signal inputted by the second clock signal terminal CLK is outputted to the same-stage signal output terminal Output, so as to scan a gate line in connection with the same-stage signal output terminal. When the input terminal of the latch output module 20 is switched off, the signal inputted by the second clock signal terminal CLK is isolated such that it cannot enter the shift register unit.

Accordingly, the shift register unit is prevented from generating a great deal of useless power consumption due to frequent flips of the signals inputted by both the first clock signal terminal CLKB and the second clock signal terminal CLK.

It should be noted that in embodiments of the present disclosure, explanations are given by taking as an example the case that the first voltage terminal VSS inputs a low level or is grounded and the second voltage terminal VDD inputs a high level.

Figure 3:
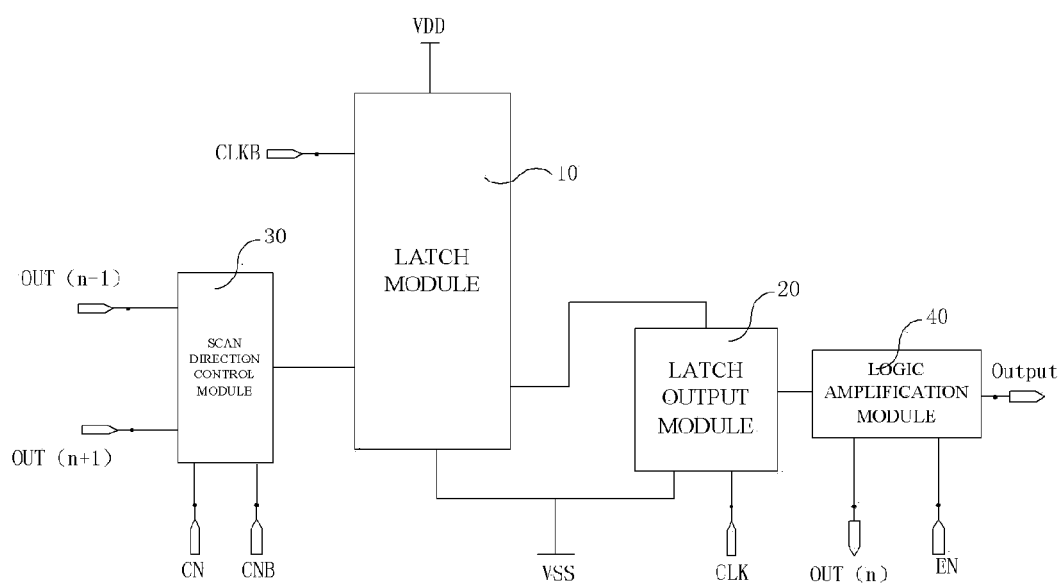
FIG. 3 is a schematic structural view of a further shift register unit provided in an embodiment of the present disclosure.

FIG. 3 is a schematic structural view of a further shift register unit provided in an embodiment of the present disclosure. As shown in the figure, in order to achieve a bidirectional scan function, the shift register unit may further comprise a scan direction control module 30.

The scan direction control module 30 may be connected to a first signal input terminal OUT (n−1), a second signal input terminal OUT (n+1), a first voltage control terminal CN, a second voltage control terminal CNB and the input terminal Input_S of the latch module 10, respectively. The scan direction control module 30 is used for transmitting a signal inputted by the first signal input terminal OUT (n−1) or the second signal input terminal OUT (n+1) to the input terminal of the latch module 10 depending on the voltages inputted by the first voltage control terminal CN and the second voltage control terminal CNB. As a result, in a forward scan, the latch module 10 may be allowed to receive the signal inputted by the first signal input terminal OUT (n−1), and in a reverse scan, the latch module 10 is allowed to receive the signal inputted by the second signal input terminal OUT (n+1), and vice versa.

Furthermore, in order to enhance the driving capacity of the circuit and improve the loading capacity of the circuit, a logic amplification module 40 may be arranged at the output terminal of the latch output module 20 so as to amplify the signal outputted by the latch output module 20.

The logical amplification module 40 may be connected to an output terminal of the latch output module 20, a third signal output terminal OUT (n), an enable signal terminal EN and the same-stage signal output terminal Output, respectively. The logical amplification module 40 is used for, under control of a signal inputted by the enable signal terminal EN, amplifying the signal outputted by the latch output module 20 and then outputting it to the same-stage signal output terminal Output. The third signal output terminal OUT (n) is connected with the output terminal of the latch output module 20. The signal outputted by the third signal output terminal OUT (n) may be the same as the signal outputted by the same-stage signal output terminal Output (discussed below).

Figure 4:
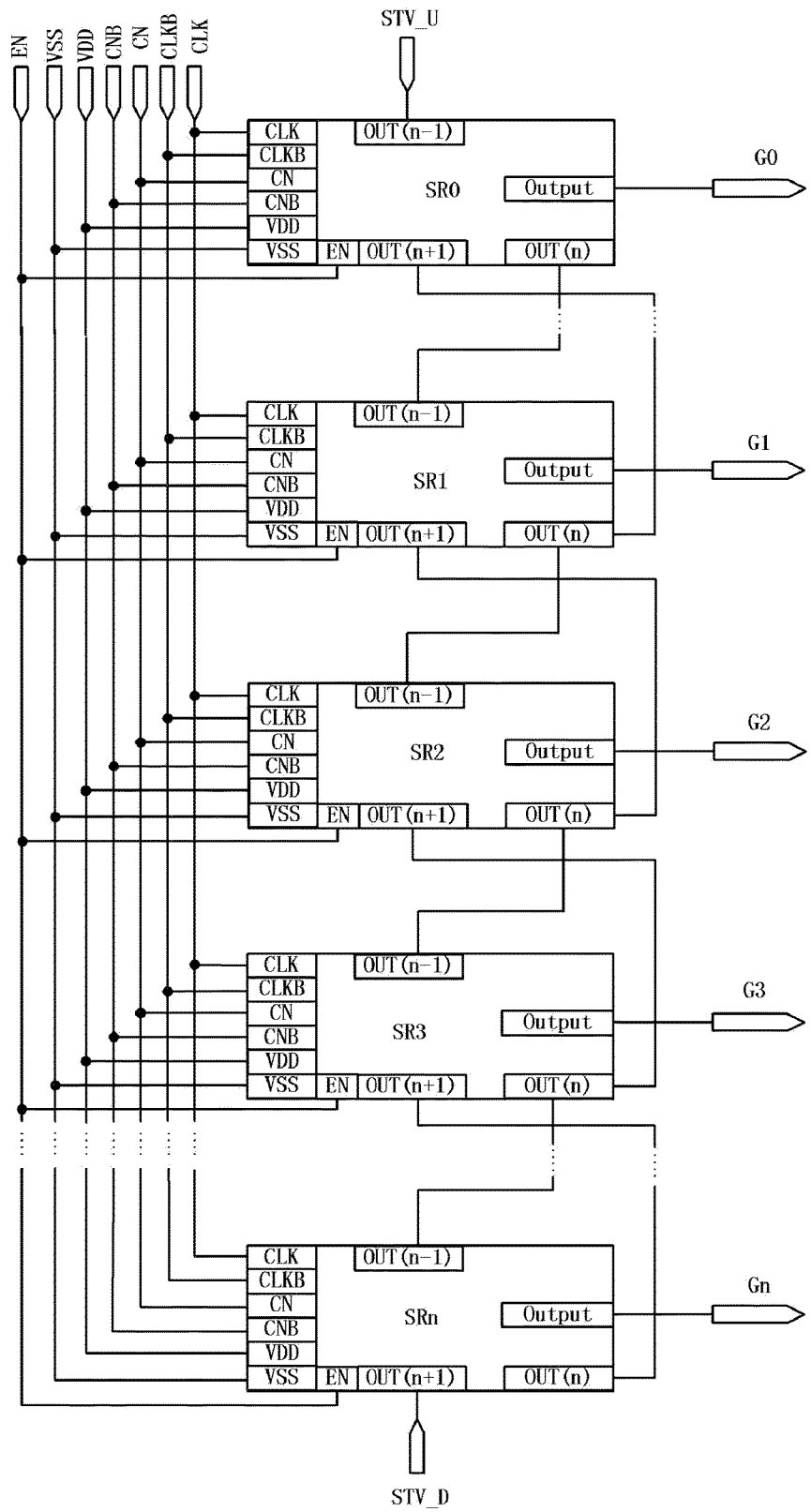
FIG. 4 is a schematic structural view of a gate driving circuit provided in an embodiment of the present disclosure.

FIG. 4 is a schematic structural view of a gate driving circuit provided in an embodiment of the present disclosure, wherein the gate driving circuit may be composed of at least two stages of shift register units SR0, SR1 . . . SRn as mentioned above.

Specifically, except for a first-stage shift register unit SR0, the first signal input terminal OUT (n−1) of each of the other shift register units is connected with the third signal output terminal OUT (n) of an adjacent shift register unit that is a preceding stage.

Except for a last-stage shift register unit SRn, the second signal input terminal OUT (n+1) of each of the other shift register units is connected with the third signal output terminal OUT (n) of an adjacent shift register unit that is a succeeding stage.

It should be noted that the number of the shift register units equals that of the gate lines in a display area. That is, the same-stage signal output terminal Output of the shift register units of each stage is connected with a row of gate line in the display area. Accordingly, progressive scan of gate lines in individual rows is achieved by shifting the inputted scan signals by means of multiple stages of shift registers.

When the first signal input terminal OUT (n−1) of the first-stage shift register unit SR0 among individual shift register units SR0, SR1 . . . SRn in the above gate driving circuit inputs a forward scan signal STV-U, the same-stage signal output terminals Output of the individual shift register units SR0, SR1 . . . SRn output the scan signal to corresponding gate lines G1, G2 . . . Gn in a forward sequence (from top to bottom). In this embodiment, the structure of the shift register unit is shown in FIG. 3.

When the second signal input terminal OUT (n+1) of the last-stage shift register unit SRn among individual shift register units SR0, SR1 . . . SRn in the above gate driving circuit inputs a reverse scan signal STV-D, the same-stage signal output terminals Output of the individual stages output the scan signal to corresponding gate lines Gn, Gn−1 . . . G1 in a reverse sequence (from bottom to top). Thus, bidirectional scan is achieved.

The above gate driving circuit has the same beneficial effects as the shift register units in the above embodiments, which will not be repeated here for simplicity.

Figure 5:
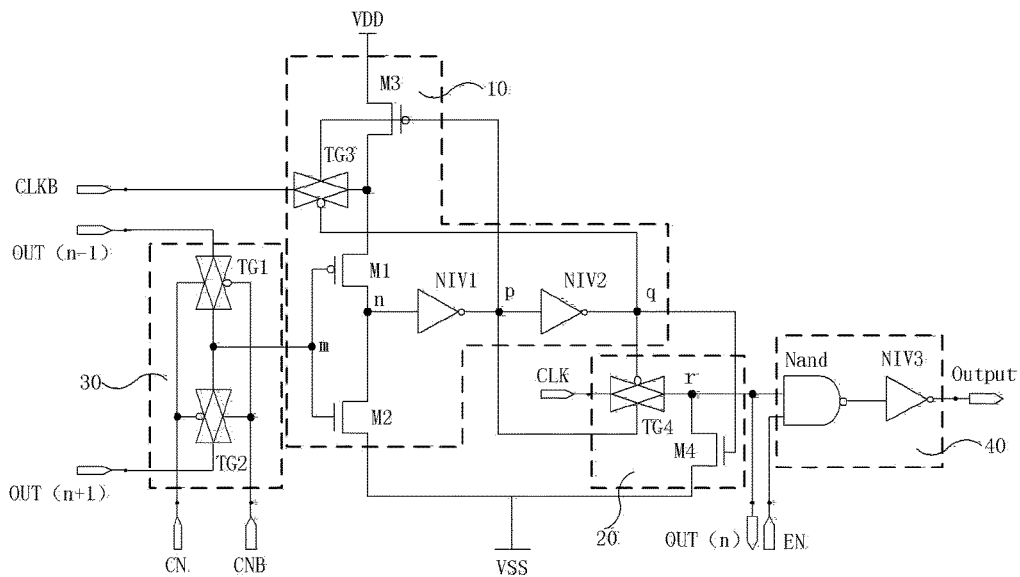
FIG. 5 is a schematic view of a circuit of the shift register unit as shown in FIG. 3.

Detailed illustration of a specific circuit of the shift register unit will be given below. FIG. 5 is a schematic view of a circuit of the shift register unit as shown in FIG. 3. As shown in the figure, the scan direction control module 30 may comprise a first transmission gate TG1 and a second transmission gate TG2.

An input terminal of the first transmission gate TG1 is connected with the first signal input terminal OUT (n−1), a first control terminal thereof is connected with the first voltage control terminal CN, a second control terminal thereof is connected with the second voltage control terminal CNB, and an output terminal thereof is connected with the input terminal Input_S of the latch module 10.

An input terminal of the second transmission gate TG2 is connected with the second signal input terminal OUT (n+1), a first control terminal thereof is connected with the second voltage control terminal CNB, a second control terminal thereof is connected with the first voltage control terminal CN, and an output terminal thereof is connected with the input terminal Input_S of the latch module 10.

When the first voltage control terminal CN is connected with a high level VDD and the second voltage control terminal CNB is connected with a low level VSS, the first transmission gate TG1 is switched on to allow the latch module 10 to receive the signal inputted by the first signal input terminal OUT (n−1) and forbid entry of the signal inputted by the second signal input terminal OUT (n+1). In this case, the shift register unit achieves a forward scan function. When the first voltage control terminal CN is connected with a low level VSS and the second voltage control terminal CNB is connected with a high level VDD, the second transmission gate TG2 is switched on to allow the latch module 10 to receive the signal inputted by the second signal input terminal OUT (n+1) and forbid entry of the signal inputted by the first signal input terminal OUT (n−1). In this case, the shift register unit achieves a reverse scan function. The scan directions are not limited in the present disclosure, and illustrations of the following embodiments are given by taking the forward scan as an example.

The latch module 10 may comprise a first transistor M1, a second transistor M2, a first inverter NIV1, a second inverter NIV2, a third transmission gate TG3 and a third transistor M3.

A gate of the first transistor M1 is connected with the output terminals of both the first transmission gate TG1 and the second transmission gate TG2.

A gate of the second transistor M2 is connected with the output terminals of both the first transmission gate TG1 and the second transmission gate TG2, a first electrode thereof is connected with the first voltage terminal VSS, and a second electrode thereof is connected with a second electrode of the first transistor M1.

An input terminal of the first inverter NIV1 is connected with the second electrode of both the first transistor M1 and the second transistor M2, and an output terminal thereof is connected with an input terminal of the second inverter NIV2.

The input terminal of the second inverter INV2 is connected with the output terminal of the first inverter NIV1, and an output terminal thereof is connected with the control terminal of the latch output module 20.

The first transistor M1 is a P-type transistor which is switched on when the gate thereof inputs a low level, and the second transistor M2 is an N-type transistor which is switched on when the gate thereof inputs a high level.

An input terminal of the third transmission gate TG3 is connected with the first clock signal terminal CLKB, an output terminal thereof is connected with a first electrode of the first transistor M1, a first control terminal thereof is connected with the output terminal of the first inverter NIV1, and a second control terminal thereof is connected with the output terminal of the second inverter NIV2.

A gate of the third transistor M3 is connected with the output terminal of the first inverter NIV1, a first electrode thereof is connected with the second voltage terminal VDD, and a second electrode thereof is connected with a first electrode of the first transistor M1.

The third transistor M3 is a P-type transistor which is switched on when the gate thereof inputs a low level.

The latch output module 20 may comprise a fourth transmission gate TG4 and a fourth transistor M4.

An input terminal of the fourth transmission gate TG4 is connected with the second clock signal terminal CLK, a first control terminal thereof is connected with the output terminal of the first inverter NIV1, and a second control terminal thereof is connected with the output terminal of the second inverter NIV2.

A gate of the fourth transistor M4 is connected with the output terminal of the second inverter NIV2, a first electrode thereof is connected with the first voltage terminal VSS, and a second electrode thereof is connected with an output terminal of the fourth transmission gate TG4.

The fourth transistor M4 is an N-type transistor which is switched on when the gate thereof inputs a high level.

The logic amplification module 40 may comprise a NAND gate Nand and a third inverter NIV3.

A first input terminal of the NAND gate Nand is connected with the third signal output terminal OUT (n) and the output terminal of the fourth transmission gate TG4, and a second input terminal thereof is connected with the enable signal terminal EN.

An input terminal of the third inverter NIV3 is connected with an output terminal of the NAND gate Nand, and an output terminal thereof is connected with the same-stage signal output terminal Output.

It should be noted that the first electrodes of all transistors in embodiments of the present disclosure can be source electrodes, and the second electrodes can be drain electrodes.

Figure 6:
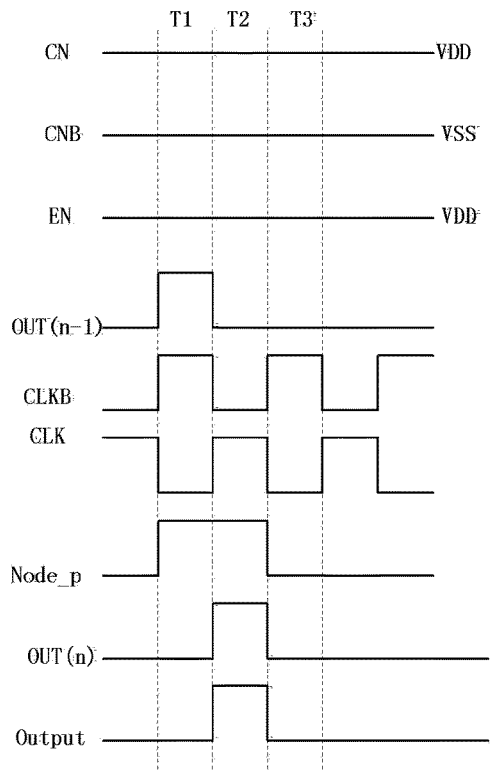
FIG. 6 is a control timing diagram for the shift register unit as shown in FIG. 5.

FIG. 6 is a control timing diagram for use in the shift register unit as shown in FIG. 5. The operation procedure of the above shift register unit in forward scan will be described in details below with reference to the timing diagram.

The enable signal terminal EN and the first voltage control terminal CN keep inputting a high level VDD, and the second voltage control terminal CNB keeps inputting a low level, so the first transmission gate TG1 is switched on while the second transmission gate TG2 is switched off.

In a first phase T1, OUT (n−1)=1; CLKB=1; CLK=0; Node_p=1; OUT (n)=0; Output=0. It should be noted that, in the following embodiments, "0" represents a low level, and "1" represents a high level.

The high level inputted by the first signal input terminal OUT (n−1) enters the latch module 10 such that node m is at a high level. Since the first transistor M1 is a P-type transistor, it is in an off state. Since the second transistor M2 is an N-type transistor, it is switched on such that the first voltage terminal VSS pulls the potential of node n down to a low level. After being inverted by the first inverter NIV1, the potential of node p is a high level such that the third transmission gate TG3 in the latch module 10 and the fourth transmission gate TG4 in the latch output module 20 can be switched on.

In this case, the high level inputted by the first clock signal terminal CLKB is inputted into the latch module 10, and since the first transistor M1 is in an off state, the high level cannot influence the potential of node n. At this point, the latch function of the latch module 10 is switched on, wherein the high level inputted by the first signal input terminal OUT (n−1) is latched to the latch unit 10.

Since the potential of node q is a low level, the fourth transistor M4 is in an off state, and the fourth transmission gate TG4 is switched on, such that the input terminal of the latch output module 20 is in an on state. The latch output module 20 transmits the low level inputted by the second clock signal terminal CLK to the logic amplification module 40.

As a low level is inputted from the latch output module 20 and a high level is inputted from the enable signal terminal EN, the NAND gate Nand outputs a high level, which is then inverted by the third inverter NIV3 such that the same-stage signal output terminal Output outputs a low level.

In conclusion, in the first phase T1, the shift register unit latches the inputted high level signal OUT (n−1), so the first phase T1 is a latch-switching-on phase of the shift register unit.

In a second phase T2, OUT (n−1)=0; CLKB=0; CLK=1; Node_p=1; OUT (n)=1; Output=1.

After the low level inputted by the first signal input terminal OUT (n−1) is transmitted to the latch module 10, the first transistor M1 is switched on and the second transistor M2 is switched off. Since the third transmission gate TG3 in the latch module 10 maintains the on state in the last phase, the low level inputted by the first clock signal terminal CLKB is transmitted to node n such that node n still remains at a low level and the state of the latch module 10 does not change (the latch function remains on). After being inverted by the first inverter NIV1 and the second inverter NIV2 respectively, the potential of node p is a high level, and the potential of node q is a low level, such that the fourth transmission gate TG4 is in an on state, the input terminal of the latch output module 20 continues maintaining an on state, the fourth transmission gate TG4 is in an on state, and the third transistor M3 is switched off. Moreover, after being inverted by the second inverter NIV2, the potential of node q is a low level, and the fourth transistor M4 is in an off state.

For the latch output module 20, since the fourth transmission gate TG4 is switched on, the high level inputted by the second clock signal terminal CLK can be transmitted to the logic amplification module 40.

As a high level is inputted from the latch output module 20 and a high level is inputted from the enable signal terminal EN, the NAND gate Nand outputs a low level, which is then inverted by the third inverter NIV3 such that the same-stage signal output terminal Output outputs a high level and scans the corresponding gate lines.

In conclusion, the second phase T2 is a data outputting phase of the shift register unit.

In a third phase T3, OUT (n−1)=0; CLKB=1; CLK=0; Node_p=0; OUT (n)=0; Output=0.

The low level inputted by the first signal input terminal OUT (n−1) is transmitted to the latch module 10 such that the first transistor M1 is switched on and the second transistor M2 is in an off state. The third transmission gate TG3 in the latch module 10 maintains the on state in the last phase, at which point since the first clock signal terminal CLKB inputs a high level to the third transmission gate TG3, the potential of node n is a high level. After being inverted by the inverters, the potential of node p is a low level, and the potential of node q is a high level. As such, the third transmission gate TG3 and the fourth transmission gate TG4 are in an off state, and the third transistor M3 is switched on such that the high level inputted by the second voltage terminal VDD is transmitted to node n, thereby maintaining the high level state of node n.

Meanwhile, since the potential of node q is a high level, the fourth transistor M4 is switched on to pull the potential of node r down to the low level inputted by the first voltage terminal VSS, and as a result, the signal inputted from the latch output module 20 to the logic amplification module 40 is at a low level.

Since a low level is inputted from the latch output module 20 and a high level is inputted from the enable signal terminal EN, the NAND gate Nand outputs a high level, which is then inverted by the third inverter NIV3 such that the same-stage signal output terminal Output outputs a low level.

In conclusion, in the third phase T3, the third transmission gate TG3 and the fourth transmission gate TG4 are both in an off state, so the latch function of the latch module 10 and the input terminal of the latch output module 20 are both in an off state. Therefore, signals inputted by the first clock signal terminal CLKB and the second clock signal terminal CLK cannot enter the shift register unit, which avoids a great deal of useless power consumption caused by frequent flips of the signals inputted by the first clock signal terminal CLKB and the second clock signal terminal CLK. Thus, the third phase T3 is a signal isolating phase.

It should be noted that phases T1-T3 can be referred to as operational time of the shift register unit. The same-stage signal output terminal Output outputs a high level only in phase T2 (i.e., the data outputting phase of the shift register), and outputs a low level during all other non-outputting time.

Thereafter, the shift register unit remains in a non-operational state until the first signal input terminal OUT (n−1) becomes a high level again. In the non-operational state, since the third transmission gate TG3 and the fourth transmission gate TG4 are both in an off state, even if the signals inputted by the first clock signal terminal CLKB and the second clock signal terminal CLK flip, they will not be inputted into the shift register unit, and hence no much useless power consumption will be caused.

It should be noted that the scan direction control module 30 and the logic amplification module 40 are not essential. Therefore, in the above description, depictions of corresponding circuit elements and corresponding signals (e.g., the signal of the first voltage control terminal CN, the signal of the second voltage control terminal CNB and the signal of the enable signal terminal EN) can be omitted. In this case, the signal inputted from the first signal input terminal OUT (n−1) is directly inputted into the input terminal Input_S of the latch module 10, and the signal outputted by the latch output module 20 is directly outputted to the same-stage signal output terminal Output.

In embodiments of the present disclosure, a display device is further provided, comprising any one of the gate driving circuits mentioned above. The display device has the same beneficial effects as the gate driving circuits provided in the above embodiments of the present disclosure, which will not be repeated here for simplicity. The display device may specifically be any liquid crystal display product or component having a display function, such as a liquid crystal display, a liquid crystal television, a digital frame, a cell phone, a tablet PC and so on.

In embodiments of the present disclosure, a method for driving a shift register unit is further provided. With the first voltage control terminal CN, the enable signal terminal EN and the second voltage terminal VDD inputting a high level and the first voltage terminal VSS inputting a low level, the method may comprise:

In a latch-switching-on phase T1, the first signal input terminal OUT (n−1) and the first clock signal terminal CLKB input a high level, and the second clock signal terminal CLK inputs a low level.

The scan direction control module 30 transmits the high level inputted by the first signal input terminal OUT (n−1) to the latch module 10. Depending on the high level inputted by the first signal input terminal OUT (n−1) and the high level inputted by the first clock signal terminal CLKB, the latch module 10 switches on the latch function of the latch module 10 and latches the high level inputted by the first signal input terminal OUT (n−1).

At the same time the latch module 10 switches on the input terminal of the latch output module 20, and outputs the low level inputted by the second clock signal terminal CLK to the logic amplification module 40.

Under the control of the high level inputted by the enable signal terminal EN, the logic amplification module 40 amplifies the low level outputted by the latch output module 20 and then outputs it to the same-stage signal output terminal Output, such that the same-stage signal output terminal Output outputs a low level.

In the data outputting phase T2, the first signal input terminal OUT (n−1) and the first clock signal terminal CLKB input a low level, and the second clock signal terminal CLK inputs a high level.

The scan direction control module 30 transmits the low level inputted by the first signal input terminal OUT (n−1) to the latch module 10. Depending on the low level inputted by the first signal input terminal OUT (n−1) and the low level inputted by the first clock signal terminal CLKB, the latch module 10 continues maintaining the on state of the input terminal of the latch output module 20.

The latch output module 20 outputs the high level inputted by the second clock signal terminal CLK to the logic amplification module 40.

Under the control of the high level inputted by the enable signal terminal EN, the logic amplification module 40 amplifies the high level outputted by the latch output module 20 and then outputs it to the same-stage signal output terminal Output such that the same-stage signal output terminal Output outputs a high level.

In the signal isolating phase T3, the first clock signal terminal CLKB inputs a high level, and the first signal input terminal OUT (n−1) and the second clock signal terminal CLK input a low level.

The scan direction control module 30 transmits the low level inputted by the first signal input terminal OUT (n−1) to the latch module 10. Depending on the low level inputted by the first signal input terminal OUT (n−1) and the high level inputted by the first clock signal terminal CLKB, the latch module 10 switches off the latch function of the latch module 10 and the input terminal of the latch output module 20. The latch module 10 isolates the signal inputted by the first clock signal terminal CLKB.

The latch output module 20 isolates the signal inputted by the second clock signal terminal CLK and outputs the low level inputted by the first voltage input terminal VSS to the logic amplification module 40.

Under the control of the high level inputted by the enable signal terminal EN, the logic amplification module 40 amplifies the low level outputted by the latch output module 20 and then outputs it to the same-stage signal output terminal Output such that the same-stage signal output terminal Output outputs a low level.

As such, the shift register unit remains in a non-operational state until the first signal input terminal OUT (n−1) becomes a high level again. In the non-operational state, since the latch function of the latch module 10 and the input terminal of the latch output module 20 are both in an off state, even if the signals inputted by the first clock signal terminal CLKB and the second clock signal terminal CLK flip, they will not be inputted into the shift register unit, and hence no much useless power consumption will be caused.

It should be noted that the scan direction control module 30 and the logic amplification module 40 are not essential. Therefore, in the above description, depictions of corresponding modules and corresponding signals (e.g., the signal of the first voltage control terminal CN, the signal of the second voltage control terminal CNB and the signal of the enable signal terminal EN) can be omitted. In this case, the signal inputted by the first signal input terminal OUT (n−1) is directly inputted to the input terminal Input_S of the latch module 10, and the signal outputted by the latch output module 20 is directly outputted to the same-stage signal output terminal Output.

Those having ordinary skills in the art can understand that all or part of the steps for implementing the above method embodiments can be performed by hardware associated with program instructions, and the program can be stored in a computer readable storage medium, which program, when executed, performs steps comprising the above method embodiments. The storage medium comprises various media capable of storing program codes, such as ROM, RAM, magnetic discs or optical discs.

The foregoing are only specific embodiments of the present disclosure, but the protection scope of the present disclosure shall not be limited thereto. Any modification or substitution that is easily conceivable for those familiar with the art within the technical disclosure of the present disclosure, is encompassed in the protection scope of the present disclosure. Therefore, the protection scope of the present disclosure shall be defined by the claims.

What is claimed is:

1. A shift register unit, comprising:
   a latch module having a first voltage terminal, a second voltage terminal, a first clock signal terminal, an input terminal and an output terminal, the latch module being provided with a latch function; and
   a latch output module having a first voltage terminal, a second clock signal terminal, a control terminal and a present-stage signal output terminal, the first voltage terminal of the latch output module being connected with the first voltage terminal of the latch module, the control terminal of the latch output module being connected with the output terminal of the latch module;
   wherein the latch module is configured for controlling switching on and off of the latch function and the latch output module depending on a signal inputted via the input terminal of the latch module and a signal inputted via the first clock signal terminal; and
   wherein the latch output module is configured for outputting a signal inputted via the second clock signal terminal to the present-stage signal output terminal when the latch output module is switched on such that a signal outputted via the present-stage signal output terminal follows the signal inputted via the second clock signal terminal, and for isolating the signal inputted via the second clock signal terminal when the latch output module is switched off.

2. The shift register unit according to claim 1, further comprising a scan direction control module having a first signal input terminal, a second signal input terminal, a first voltage control terminal, a second voltage control terminal and an output terminal, the output terminal of the scan direction control module being connected with the input terminal of the latch module, wherein the scan direction control module is configured for transmitting a signal inputted via the first signal input terminal or the second signal input terminal to the input terminal of the latch module depending on voltages inputted via the first voltage control terminal and the second voltage control terminal.

3. The shift register unit according to claim 2, wherein the scan direction control module comprises:
   a first transmission gate having an input terminal, a first control terminal, a second control terminal and an output terminal, the input terminal being connected with the first signal input terminal, the first control terminal being connected with the first voltage control terminal, the second control terminal being connected with the second voltage control terminal, the output terminal being connected with the output terminal of the scan direction control module; and
   a second transmission gate having an input terminal, a first control terminal, a second control terminal and an output terminal, the input terminal being connected with the second signal input terminal, the first control terminal being connected with the second voltage control terminal, the second control terminal being connected with the first voltage control terminal, the output terminal being connected with the output terminal of the scan direction control module.

4. The shift register unit according to claim 3, wherein the latch module comprises:
   a first transistor having a gate, a first electrode and a second electrode, the gate being connected with the output terminals of both the first transmission gate and the second transmission gate;
   a second transistor having a gate, a first electrode and a second electrode, the gate being connected with the output terminals of both the first transmission gate and the second transmission gate, the first electrode being connected with the first voltage terminal, the second electrode being connected with the second electrode of the first transistor;
   a first inverter having an input terminal and an output terminal, the input terminal being connected with the second electrode of the first transistor and the second electrode of the second transistor;

a second inverter having an input terminal and an output terminal, the input terminal being connected with the output terminal of the first inverter, the output terminal being connected with the output terminal of the latch module;

a third transmission gate having an input terminal, a first control terminal, a second control terminal and an output terminal, the input terminal being connected with the first clock signal terminal, the output terminal being connected with the first electrode of the first transistor, the first control terminal being connected with the output terminal of the first inverter, the second control terminal being connected with the output terminal of the second inverter; and a third transistor having a gate, a first electrode and a second electrode, the gate being connected with the output terminal of the first inverter, the first electrode being connected with the second voltage terminal, the second electrode being connected with the first electrode of the first transistor.

5. The shift register unit according to claim 4, wherein the first transistor and the third transistor are both P-type transistors and the second transistor is an N-type transistor, the first electrodes being source electrodes, the second electrodes being drain electrodes.

6. The shift register unit according to claim 4, wherein the latch output module comprises:

a fourth transmission gate having an input terminal, a first control terminal, a second control terminal and an output terminal, the input terminal being connected with the second clock signal terminal, the first control terminal being connected with the output terminal of the first inverter, the second control terminal being connected with the output terminal of the second inverter, the output terminal of the fourth transmission gate being connected with the present-stage signal output terminal of the latch output module; and a fourth transistor having a gate, a first electrode and a second electrode, the gate being connected with the output terminal of the second inverter, the first electrode being connected with the first voltage terminal, the second electrode being connected with the output terminal of the fourth transmission gate.

7. The shift register unit according to claim 6, wherein the fourth transistor is an N-type transistor, the first electrode being a source electrode, the second electrode being a drain electrode.

8. The shift register unit according to claim 6, further comprising a logic amplification module having an input terminal, an enable signal terminal, a third signal output terminal and an output terminal, the input terminal of the logic amplification module being connected with the present-stage signal output terminal of the latch output module, wherein the logical amplification module being configured for, under control of a signal inputted via the enable signal terminal, amplifying the signal outputted via the present-stage signal output terminal of the latch output module for output as a present-stage output signal.

9. The shift register unit according to claim 8, wherein the logic amplification module comprises:

a NAND gate having a first input terminal, a second input terminal and an output terminal, the first input terminal being connected with the third signal output terminal and the output terminal of the fourth transmission gate, the second input terminal being connected with the enable signal terminal; and a third inverter having an input terminal and output terminal, the input terminal being connected with the output terminal of the NAND gate, the output terminal of the third inverter being connected with the output terminal of the logic amplification module.

10. A gate driving circuit comprising at least two stages of shift register units according to claim 9, wherein, except for a first-stage shift register unit, the first signal input terminal of each of the shift register units is connected with the third signal output terminal of an adjacent shift register unit that is a preceding stage; and wherein, except for a last-stage shift register unit, the second signal input terminal of each of the shift register units is connected with the third signal output terminal of an adjacent shift register unit that is a succeeding stage.

11. A display device comprising the gate driving circuit according to claim 10.

12. A gate driving circuit comprising at least two stages of shift register units according to claim 8, wherein, except for a first-stage shift register unit, the first signal input terminal of each of the shift register units is connected with the third signal output terminal of an adjacent shift register unit that is a preceding stage; and wherein, except for a last-stage shift register unit, the second signal input terminal of each of the shift register units is connected with the third signal output terminal of an adjacent shift register unit that is a succeeding stage.

13. A display device comprising the gate driving circuit according to claim 12.

14. A method for driving the shift register unit according to claim 1, the second voltage terminal being supplied with a high level, the first voltage terminal be supplied with a low level, the method comprising:

in a latch-switching-on phase, supplying both the input terminal of the latch module and the first clock signal terminal with a high level, and supplying the second clock signal terminal with a low level, such that depending on the high level inputted via the input terminal of the latch module and the high level inputted via the first clock signal terminal, the latch module switches on the latch function of the latch module to latch the high level inputted via the first signal input terminal, and switches on the latch output module to output the low level inputted via the second clock signal terminal to the present-stage signal output terminal to allow output of a low level via the present-stage signal output terminal;

in a data outputting phase, supplying both the input terminal of the latch module and the first clock signal terminal with a low level, and supplying the second clock signal terminal with a high level, such that depending on the low level inputted via the input terminal of the latch module and the low level inputted via the first clock signal terminal, the latch module continues maintaining an on state of the input terminal of the latch output module, and the latch output module outputs the high level inputted via the second clock signal terminal to the present-stage signal output terminal to allow output of a high level via the present-stage signal output terminal; and in a signal isolating phase, supplying the first clock signal terminal with a high level, and supplying both the input terminal of the latch module and the second clock signal terminal with a low level, such that depending on the low level inputted via the input terminal of the latch module and the high level inputted via the first clock signal terminal, the latch module switches off the latch function of the latch module and the latch output module, wherein the latch module isolates the signal inputted via the first clock signal terminal, and the latch output module isolates the signal inputted via the second clock signal terminal and outputs the low level inputted via the first voltage input terminal to the present-stage signal output terminal to allow output of a low level by the present-stage signal output terminal.

* * * * *

UNITED STATES PATENT AND TRADEMARK OFFICE
CERTIFICATE OF CORRECTION

PATENT NO. : 9,799,287 B2
APPLICATION NO. : 14/785251
DATED : October 24, 2017
INVENTOR(S) : Haigang Qing and Xiaojing Qi It is certified that error appears in the above-identified patent and that said Letters Patent is hereby corrected as shown below:

On the Title Page

In Item [71], at Line 4, delete "Chengu", and insert --Chengdu--.

Signed and Sealed this
Eleventh Day of September, 2018

Andrei Iancu
*Director of the United States Patent and Trademark Office*